US009048797B2

(12) United States Patent
Kim et al.

(10) Patent No.: US 9,048,797 B2
(45) Date of Patent: Jun. 2, 2015

(54) HIGH EFFICIENCY, REMOTELY RECONFIGURABLE REMOTE RADIO HEAD UNIT SYSTEM AND METHOD FOR WIRELESS COMMUNICATIONS

(71) Applicant: DALI SYSTEMS CO. LTD., George Town, Grand Cayman (KY)

(72) Inventors: Wan-Jong Kim, Port Moody (CA); Kyoung-Joon Cho, Coquitlam (CA); Shawn Patrick Stapleton, Burnaby (CA); Ying Xiao, Coquitlam (CA)

(73) Assignee: DALI SYSTEMS CO. LTD., George Town Grand Cayman (KY)

( * ) Notice: Subject to any disclaimer, the term of this patent is extended or adjusted under 35 U.S.C. 154(b) by 0 days.

(21) Appl. No.: 14/335,647

(22) Filed: Jul. 18, 2014

(65) Prior Publication Data

US 2015/0080054 A1    Mar. 19, 2015

Related U.S. Application Data

(63) Continuation of application No. 14/020,425, filed on Sep. 6, 2013, now Pat. No. 8,824,595, which is a continuation of application No. 12/928,943, filed on Dec. 21, 2010, now Pat. No. 8,542,768.

(60) Provisional application No. 61/288,847, filed on Dec. 21, 2009.

(51) Int. Cl.
*H04L 25/49*   (2006.01)
*H03F 1/32*    (2006.01)
(Continued)

(52) U.S. Cl.
CPC .............. *H03F 1/3247* (2013.01); *H03F 3/68* (2013.01); *H04B 1/0064* (2013.01); *H04W 88/085* (2013.01)

(58) Field of Classification Search
CPC ..... H04L 27/367; H04L 27/368; H04L 25/08; H04B 1/62; H04B 1/0483; H04B 2001/0408; H04B 2001/0441; H03F 2201/3233; H03F 1/3247
USPC ............... 375/285, 295–297; 455/501, 67.13, 455/114.2, 114.3
See application file for complete search history.

(56) References Cited

U.S. PATENT DOCUMENTS

| 4,638,248 A | 1/1987 | Schweickert |
| 5,678,198 A | 10/1997 | Lemson |

(Continued)

FOREIGN PATENT DOCUMENTS

| CA | 2 616 323 A1 | 12/2007 |
| CN | 102948071 A | 2/2013 |

(Continued)

OTHER PUBLICATIONS

International Search Report and Written Opinion of the International Searching Authority for corresponding International application No. PCT/IB2010/003455 mailed on Jul. 6, 2011, 11 pages.

(Continued)

*Primary Examiner* — Khanh C Tran
(74) *Attorney, Agent, or Firm* — Kilpatrick Townsend & Stockton LLP

(57) ABSTRACT

A remote radio head unit (RRU) system is disclosed. The present invention is based on the method of adaptive digital predistortion to linearize a power amplifier inside the RRU. The power amplifier characteristics such as variation of linearity and asymmetric distortion of the amplifier output signal are monitored by a wideband feedback path and controlled by the adaptation algorithm in a digital module. Therefore, embodiments of the present invention can compensate for the nonlinearities as well as memory effects of the power amplifier systems and also improve performance, in terms of power added efficiency, adjacent channel leakage ratio and peak-to-average power ratio. The present disclosure enables a power amplifier system to be field reconfigurable and support multi-modulation schemes (modulation agnostic), multi-carriers, multi-frequency bands and multi-channels. Consequentially, the remote radio head system is particularly suitable for wireless transmission systems, such as base-stations, repeaters, and indoor signal coverage systems.

18 Claims, 12 Drawing Sheets

(51) Int. Cl.
*H03F 3/68* (2006.01)
*H04B 1/00* (2006.01)
*H04W 88/08* (2009.01)

(56) References Cited

U.S. PATENT DOCUMENTS

| | | | |
|---|---|---|---|
| 5,757,229 A | 5/1998 | Mitzlaff | |
| 6,246,286 B1 | 6/2001 | Persson | |
| 6,301,579 B1 | 10/2001 | Becker | |
| 6,424,225 B1 | 7/2002 | Choi et al. | |
| 6,625,429 B1 | 9/2003 | Yamashita | |
| 6,747,649 B1 | 6/2004 | San-z Pastor et al. | |
| 6,751,447 B1 | 6/2004 | Jin et al. | |
| 6,903,604 B2 | 6/2005 | Kim | |
| 7,102,442 B2 | 9/2006 | Anderson | |
| 7,109,998 B2 | 9/2006 | Smith | |
| 7,362,125 B2 | 4/2008 | Gupta et al. | |
| 7,372,918 B2 | 5/2008 | Muller et al. | |
| 7,440,496 B2 * | 10/2008 | Peek et al. | 375/220 |
| 7,535,298 B2 | 5/2009 | Sihlbom et al. | |
| 7,542,518 B2 | 6/2009 | Kim et al. | |
| 7,583,754 B2 | 9/2009 | Liu | |
| 7,593,450 B2 | 9/2009 | Conyers et al. | |
| 7,606,324 B2 | 10/2009 | Cai et al. | |
| 7,831,221 B2 | 11/2010 | Leffel et al. | |
| RE42,287 E | 4/2011 | Apodaca et al. | |
| 8,149,950 B2 | 4/2012 | Kim et al. | |
| 8,213,880 B2 | 7/2012 | van Zelm et al. | |
| 8,218,678 B2 | 7/2012 | Kim | |
| 8,542,768 B2 | 9/2013 | Kim et al. | |
| 8,811,925 B2 * | 8/2014 | Satapathy et al. | 455/234.1 |
| 8,824,595 B2 | 9/2014 | Kim et al. | |
| 2002/0027958 A1 | 3/2002 | Kolanek | |
| 2003/0179829 A1 | 9/2003 | Pinckley et al. | |
| 2004/0189378 A1 | 9/2004 | Suzuki et al. | |
| 2005/0026574 A1 | 2/2005 | Ocenasek et al. | |
| 2005/0079834 A1 | 4/2005 | Maniwa et al. | |
| 2005/0262498 A1 | 11/2005 | Ferguson et al. | |
| 2006/0012426 A1 | 1/2006 | Nezami | |
| 2006/0270366 A1 | 11/2006 | Rozenblit et al. | |
| 2007/0075780 A1 | 4/2007 | Krvavac et al. | |
| 2007/0171234 A1 | 7/2007 | Crawfis et al. | |
| 2008/0130786 A1 * | 6/2008 | Tudosoiu et al. | 375/297 |
| 2008/0130788 A1 | 6/2008 | Copeland | |
| 2008/0265996 A1 | 10/2008 | Kim et al. | |
| 2009/0067541 A1 | 3/2009 | Byun et al. | |
| 2009/0146736 A1 | 6/2009 | Kim et al. | |
| 2009/0163156 A1 | 6/2009 | Rofougaran et al. | |
| 2009/0184763 A1 | 7/2009 | Kim | |
| 2009/0232191 A1 | 9/2009 | Gupta et al. | |
| 2010/0087227 A1 * | 4/2010 | Francos et al. | 455/562.1 |
| 2010/0202563 A1 | 8/2010 | Yan et al. | |
| 2010/0254299 A1 | 10/2010 | Kenington | |
| 2011/0150130 A1 | 6/2011 | Kenington | |
| 2011/0156815 A1 | 6/2011 | Kim et al. | |

FOREIGN PATENT DOCUMENTS

| | | |
|---|---|---|
| CN | 102870494 A | 9/2013 |
| EP | 0 544 117 A1 | 6/1993 |
| EP | 1746720 A1 | 1/2007 |
| EP | 2 517 353 | 10/2012 |
| EP | 2 524 568 | 11/2012 |
| ID | 2013/00167 A | 1/2013 |
| IN | 6163/CHENP/2012 A | 11/2013 |
| JP | 2004-165900 A | 6/2004 |
| JP | 2006-094043 A | 4/2006 |
| JP | 2013/515424 A | 2/2013 |
| JP | 2013-515423 A | 5/2013 |
| WO | WO 01/08295 A1 | 2/2001 |
| WO | WO 01/08297 A1 | 2/2001 |
| WO | WO 2004/057758 A1 | 7/2004 |
| WO | WO 2008/154077 A1 | 12/2006 |
| WO | WO 2009/046627 A1 | 4/2009 |
| WO | WO 2011/077247 A2 | 6/2011 |
| WO | WO 2011/098861 A1 | 8/2011 |

OTHER PUBLICATIONS

Extended European Search Report for corresponding European Patent Application No. 10848623.4 dated Sep. 9, 2014, 15 pages.

English Translation and Notification of the First Office Action for corresponding Chinese Patent Application No. 201080064443.7 dated Sep. 22, 2014, 17 pages.

English Translation and Notice of Reasons for Rejection for corresponding Japanese Patent Application No. P2012-545471 dated Nov. 25, 2014, 4 pages.

Non-Final Office Action for U.S. Appl. No. 12/928,943 mailed on Feb. 7, 2013, 6 pages.

Notice of Allowance for U.S. Appl. No. 12/928,943 mailed on May 21, 2013, 9 pages.

Non-Final Office Action for U.S. Appl. No. 14/020,425 mailed on Jan. 16, 2014, 10 pages.

Notice of Allowance for U.S. Appl. No. 14/020,425 mailed on May 9, 2014, 9 pages.

* cited by examiner

FIG. 1. Remote Radio Head Unit

Figure 3. Polynomial based digital predistorter function

FIG. 4. Digital Predistortion Block Diagram

Figure 5 Analog Quadrature Modulator Compensation Block

Figure 9 Digital Hybrid Module

Figure 11 Dual Channel Remote Radio Head

8 Channel Dual Band RRU

HIGH EFFICIENCY, REMOTELY RECONFIGURABLE REMOTE RADIO HEAD UNIT SYSTEM AND METHOD FOR WIRELESS COMMUNICATIONS

RELATED APPLICATIONS

This application is a continuation of U.S. patent application Ser. No. 14/020,425, filed Sep. 6, 2013 which is a continuation of: U.S. patent application Ser. No. 12/928,943, filed Dec. 21, 2010, now U.S. Pat. No. 8,542,768, issued Sep. 24, 2013, which claims the benefit of U.S. patent application Ser. No. 61/288,847, filed Dec. 21, 2009. Each of these applications is hereby incorporated by reference in its entirety for all purposes.

FIELD OF THE INVENTION

The present invention generally relates to wireless communication systems using power amplifiers and remote radio head units (RRU or RRH). More specifically, the present invention relates to RRU which are part of a distributed base station in which all radio-related functions are contained in a small single unit that can be deployed in a location remote from the main unit. Multi-mode radios capable of operating according to GSM, HSPA, LTE, and WiMAX standards and advanced software configurability are key features in the deployment of more flexible and energy-efficient radio networks. The present invention can also serve multi-frequency bands within a single RRU to economize the cost of radio network deployment.

BACKGROUND OF THE INVENTION

Wireless and mobile network operators face the continuing challenge of building networks that effectively manage high data-traffic growth rates. Mobility and an increased level of multimedia content for end users require end-to-end network adaptations that support both new services and the increased demand for broadband and flat-rate Internet access. In addition, network operators must consider the most cost-effective evolution of the networks towards 4G. Wireless and mobile technology standards are evolving towards higher bandwidth requirements for both peak rates and cell throughput growth. The latest standards supporting this are HSPA+, WiMAX, TD-SCDMA and LTE. The network upgrades required to deploy networks based on these standards must balance the limited availability of new spectrum, leverage existing spectrum, and ensure operation of all desired standards. This all must take place at the same time during the transition phase, which usually spans many years. Distributed open base station architecture concepts have evolved in parallel with the evolution of the standards to provide a flexible, cheaper, and more scalable modular environment for managing the radio access evolution, FIG. 6. For example, the Open Base Station Architecture Initiative (OBSAI), the Common Public Radio Interface (CPRI), and the IR Interface standards introduced standardized interfaces separating the Base Station server and the remote radio head part of a base station by an optical fiber.

The RRU concept constitutes a fundamental part of a state-of-the-art base station architecture. However, RRUs to-date are power inefficient, costly and inflexible. Their poor DC to RF power conversion insures that they will have a large mechanical housing. The RRU demands from the service providers are also for greater flexibility in the RRU platform. As standards evolve, there is a need for a software upgradable RRU. Today RRUs lack the flexibility and performance that is required by service providers. The RRU performance limitations are driven in part by the poor power efficiency of the RF amplifiers. Thus there has been a need for an efficient, flexible RRU architecture that is field reconfigurable.

SUMMARY OF THE INVENTION

Accordingly, the present invention has been made in view of the above problems in the prior art, and it is an object of the present invention to provide a high performance and cost effective method of multi-frequency bands RRU systems enabled by high linearity and high efficiency power amplifiers for wideband communication system applications. The present disclosure enables a RRU to be field reconfigurable, and supports multi-modulation schemes (modulation agnostic), multi-carriers, multi-frequency bands, and multi-channels.

To achieve the above objects, according to the present invention, the technique is generally based on the method of adaptive digital predistortion to linearize RF power amplifiers. Various embodiments of the invention are disclosed, including single band, dual band, and multi-band RRU's. Another embodiment is a multi-band multi-channel RRU. In an embodiment, the combination of crest factor reduction, PD, power efficiency boosting techniques as well as coefficient adaptive algorithms are utilized within a PA system. In another embodiment, analog quadrature modulator compensation structure is also utilized to enhance performance.

Some embodiments of the present invention are able to monitor the fluctuation of the power amplifier characteristics and to self-adjust by means of a self-adaptation algorithm. One such self-adaptation algorithm presently disclosed is called a digital predistortion algorithm, which is implemented in the digital domain.

Applications of the present invention are suitable for use with all wireless base-stations, remote radio heads, distributed base stations, distributed antenna systems, access points, mobile equipment and wireless terminals, portable wireless devices, and other wireless communication systems such as microwave and satellite communications. The present invention is also field upgradable through a link such as an Ethernet connection to a remote computing center.

THE FIGURES

Further objects and advantages of the present invention can be more fully understood from the following detailed description taken in conjunction with the accompanying drawings in which.

GLOSSARY

Acronyms used herein have the following meanings:
ACLR Adjacent Channel Leakage Ratio
ACPR Adjacent Channel Power Ratio
ADC Analog to Digital Converter
AQDM Analog Quadrature Demodulator
AQM Analog Quadrature Modulator
AQDMC Analog Quadrature Demodulator Corrector
AQMC Analog Quadrature Modulator Corrector
BPF Bandpass Filter
COMA Code Division Multiple Access
CFR Crest Factor Reduction
DAC Digital to Analog Converter
DET Detector
DHMPA Digital Hybrid Mode Power Amplifier
DDC Digital Down Converter
DNC Down Converter
DPA Doherty Power Amplifier
DQDM Digital Quadrature Demodulator
DQM Digital Quadrature Modulator
DSP Digital Signal Processing
DUC Digital Up Converter
EER Envelope Elimination and Restoration
EF Envelope Following
ET Envelope Tracking
EVM Error Vector Magnitude
FFLPA Feedforward Linear Power Amplifier
FIR Finite Impulse Response
FPGA Field-Programmable Gate Array
GSM Global System for Mobile communications
I-Q In-phase/Quadrature
IF Intermediate Frequency
LINC Linear Amplification using Nonlinear Components
LO Local Oscillator
LPF Low Pass Filter
MCPA Multi-Carrier Power Amplifier
MDS Multi-Directional Search
OFDM Orthogonal Frequency Division Multiplexing
PA Power Amplifier
PAPR Peak-to-Average Power Ratio
PD Digital Baseband Predistortion
PLL Phase Locked Loop
QAM Quadrature Amplitude Modulation
QPSK Quadrature Phase Shift Keying
RF Radio Frequency
RRU Remote Radio Head Unit
SAW Surface Acoustic Wave Filter
SERDES Serializer/Deserializer
UMTS Universal Mobile Telecommunications System
UPC Up Converter
WCDMA Wideband Code Division Multiple Access
WLAN Wireless Local Area Network.

DETAILED DESCRIPTION OF THE INVENTION

The present invention is a novel RRU system that utilizes an adaptive digital predistortion algorithm. The present invention is a hybrid system of digital and analog modules. The interplay of the digital and analog modules of the hybrid system both linearize the spectral regrowth and enhance the power efficiency of the PA while maintaining or increasing the wide bandwidth. The present invention, therefore, achieves higher efficiency and higher linearity for wideband complex modulation carriers.

Figure 1:
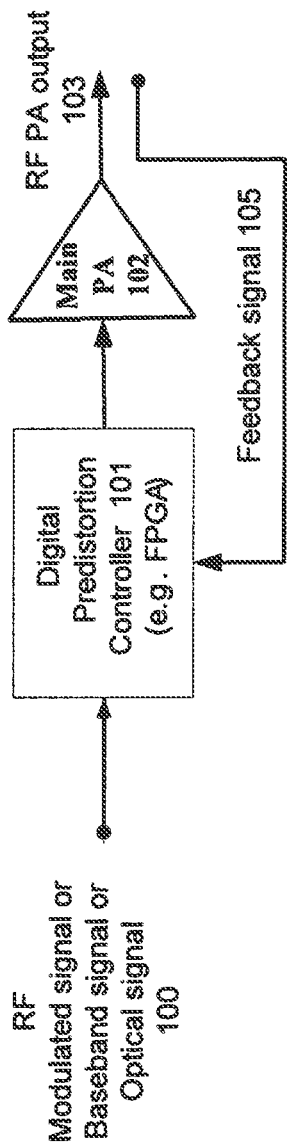
FIG. 1 is a block diagram showing the basic form of a Remote Radio head unit system.

FIG. 1 is a high level block diagram showing the basic system architecture of what is sometimes referred to as a Remote Radio Head Unit, or RRU, which can be thought of, at least for some embodiments, as comprising digital and analog modules and a feedback path. The digital module is the digital predistortion controller 101 which comprises the PD algorithm, other auxiliary DSP algorithms, and related digital circuitries. The analog module is the main power amplifier 102, other auxiliary analog circuitries such as DPA, and related peripheral analog circuitries of the overall system. The present invention operates as a "blackbox", plug and play type system because it accepts RF modulated signal 100 as its input, and provides a substantially identical but amplified RF signal 103 as its output, therefore, it is RF-in/RF-out. Baseband input signals can be applied directly to the Digital Predistorter Controller according to one embodiment of the present invention. An Optical input signal can be applied directly to the Digital Predistorter Controller according to one embodiment of the present invention. The feedback path essentially provides a representation of the output signal to the predistortion controller 101. The present invention is sometimes referred to as a Remote Radio head Unit (RRU) hereinafter.

Figure 2:
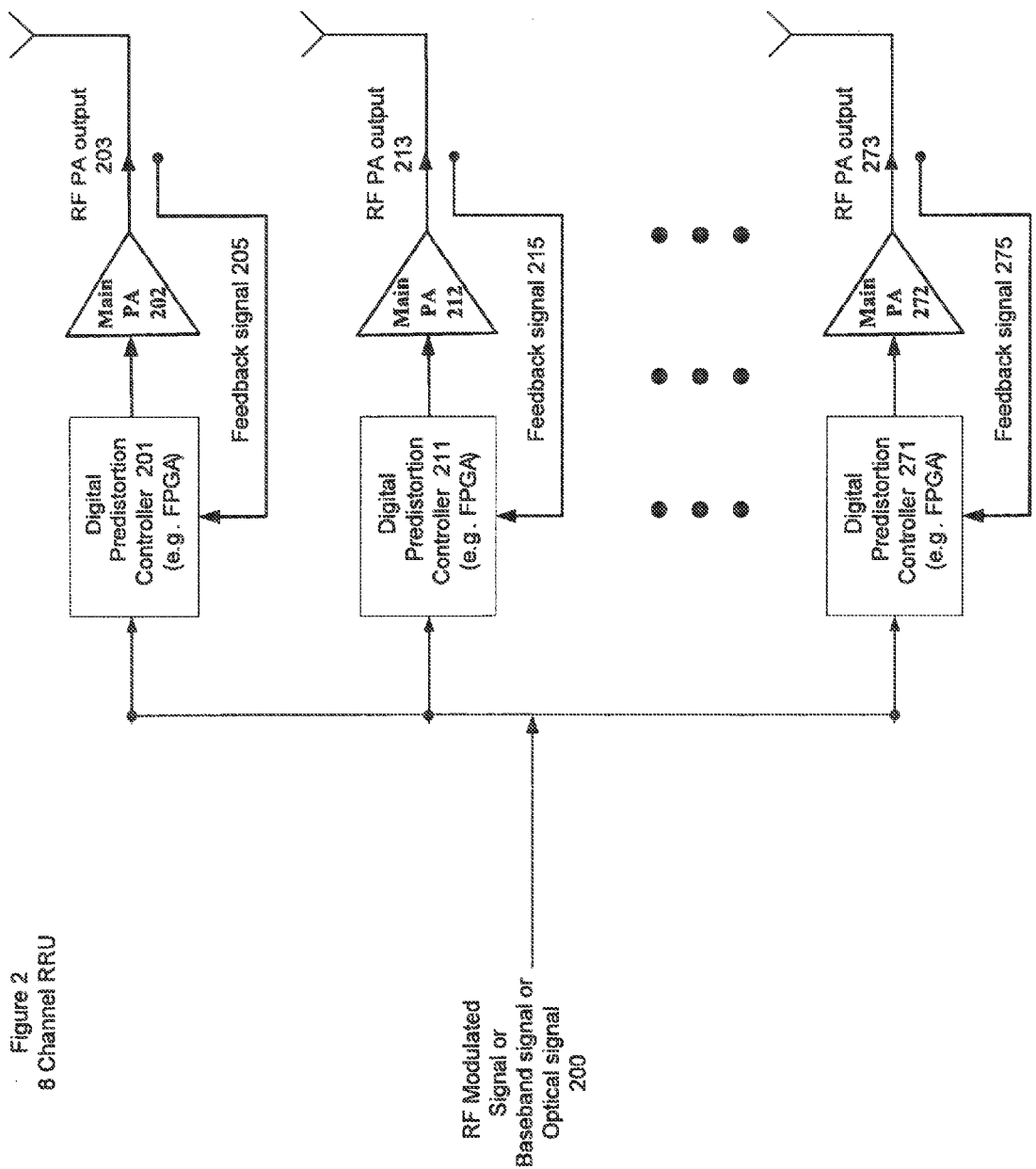
FIG. 2 is a block diagram showing a multi-channel Remote Radio Head Unit according to one embodiment of the present invention.

FIG. 2 illustrates in schematic block diagram form an embodiment of an eight channel (or n channel) RRU in which an input signal 200 is provided. Depending on the implementation, the input signal can take the form of an RF modulated signal, a baseband signal, or an optical signal. The input signal 200 is fed to a plurality of channels, where each channel includes a digital predistortion (DPD) controller, indicated at 201, 211 and 271, respectively. The DPD can be implemented in an FPGA in at least some embodiments. For each channel, the DPD outputs are fed to associated PA's 202, 212 and 272, respectively, and the PA outputs 203, 213 and 273 are fed back to that channel's DPD's.

Figure 3:
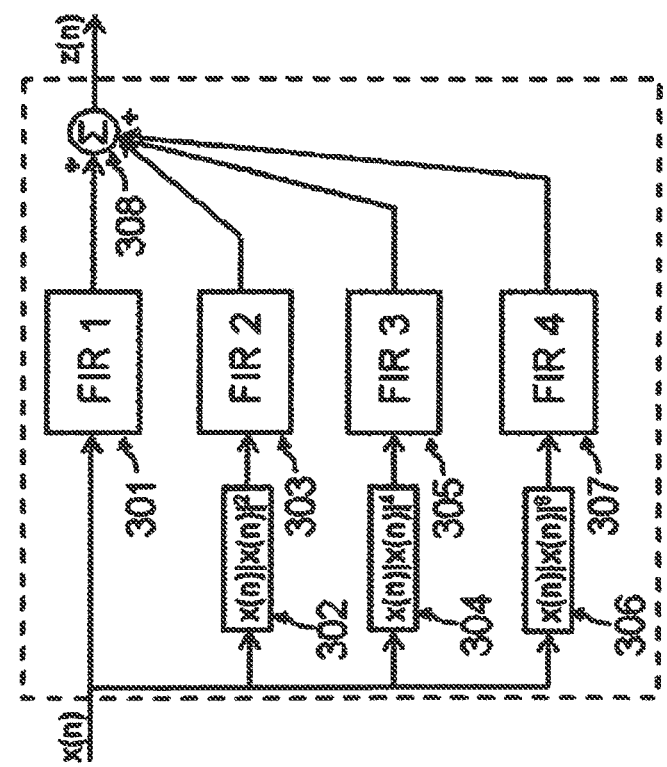
FIG. 3 is a block diagram showing polynomial based predistortion in a Remote Radio head system of the present invention.

FIG. 3 illustrates a polynomial-based digital predistorter function in the RRU system of the present invention. The PD in the present invention generally utilizes an adaptive LUT-based digital predistortion system. More specifically, the PD illustrated in FIG. 3, and in embodiments disclosed from FIGS. 9-12 discussed hereinafter, are processed in the digital processor by an adaptive algorithm, presented in U.S. patent application Ser. No. 11/961,969, entitled A Method for Baseband Predistortion Linearization in Multi-Channel Wideband Communication Systems. The PD for the RRU system in FIG. 3. has multiple finite impulse response (FIR) filters, that is, FIR1 301, FIR2 303, FIR3 305, and FIR4 307. The PD also contains the third order product generation block 302, the fifth order product generation block 304, and the seventh order product generation block 306. The output signals from FIR filters are combined in the summation block 308. Coefficients for multiple FIR filters are updated by the digital predistorter algorithm based on the error between the reference input signal and the amplified power output signal.

Figure 4:
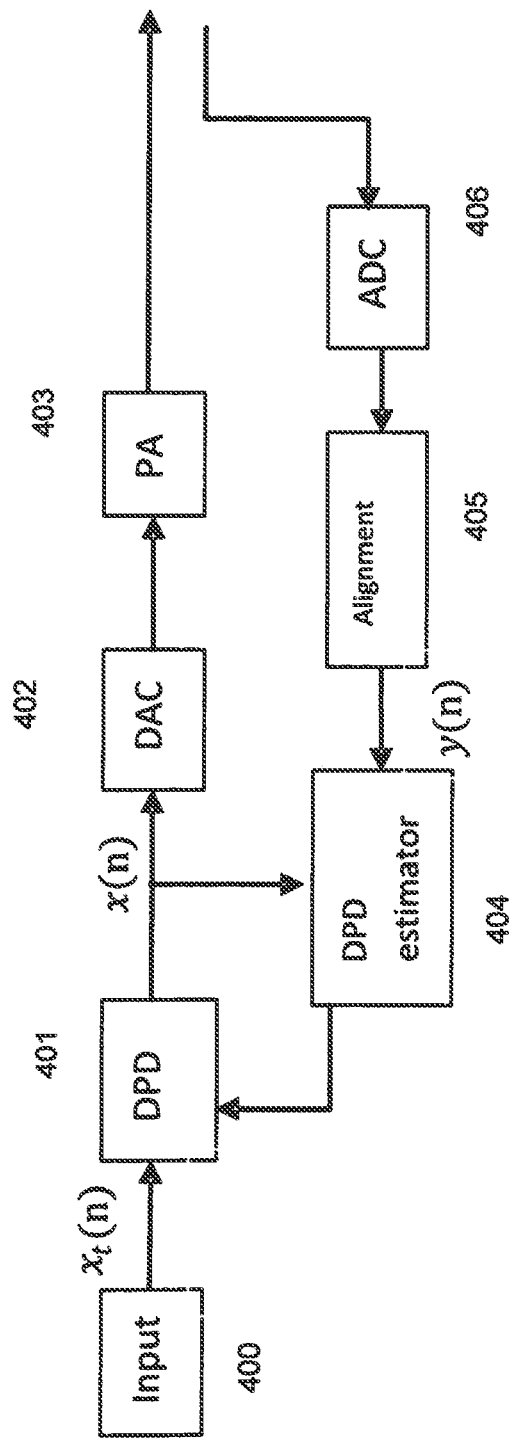
FIG. 4 is a block diagram of the digital predistortion algorithm applied for self-adaptation in a remote radio head unit system of the present invention.

FIG. 4 shows in block diagram form additional details of an embodiment including a DPD in accordance with the present invention and is discussed in greater detail hereinafter. In general, the input 400 is provided to the DPD 401. The output of the DPD is fed to a DAC 402 and thence to the PA 403. A feedback signal from the output of the PA is received by ADC 406, and the digital form is supplied to alignment logic 405, after which the aligned signal is provided to DPD estimator logic 404, which also receives an input from the output of the DPD 401. The output of the DPD estimator is then fed back to the DPD 401.

Figure 5:
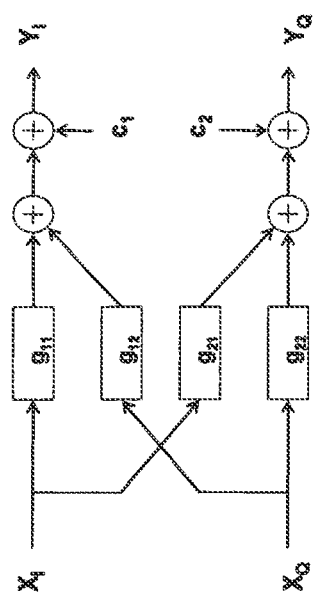
FIG. 5 illustrates an analog modulator compensation block.

FIG. 5 illustrates an analog modulator compensation block. The input signal is separated into an in-phase component $X_I$ and a quadrature component $X_Q$. The analog quadrature modulator compensation structure comprises four real filters {g11, g12, g21, g22} and two DC offset compensation parameters c1, c2. The DC offsets in the AQM will be compensated by the parameters c1, c2. The frequency dependence of the AQM will be compensated by the filters {g11, g12, g21, g22}. The order of the real filters is dependent on the level of compensation required. The output signals $Y_I$ and $Y_Q$ will be presented to an AQM's in-phase and quadrature ports, discussed hereinafter in connection with FIG. 9.

Figure 6:
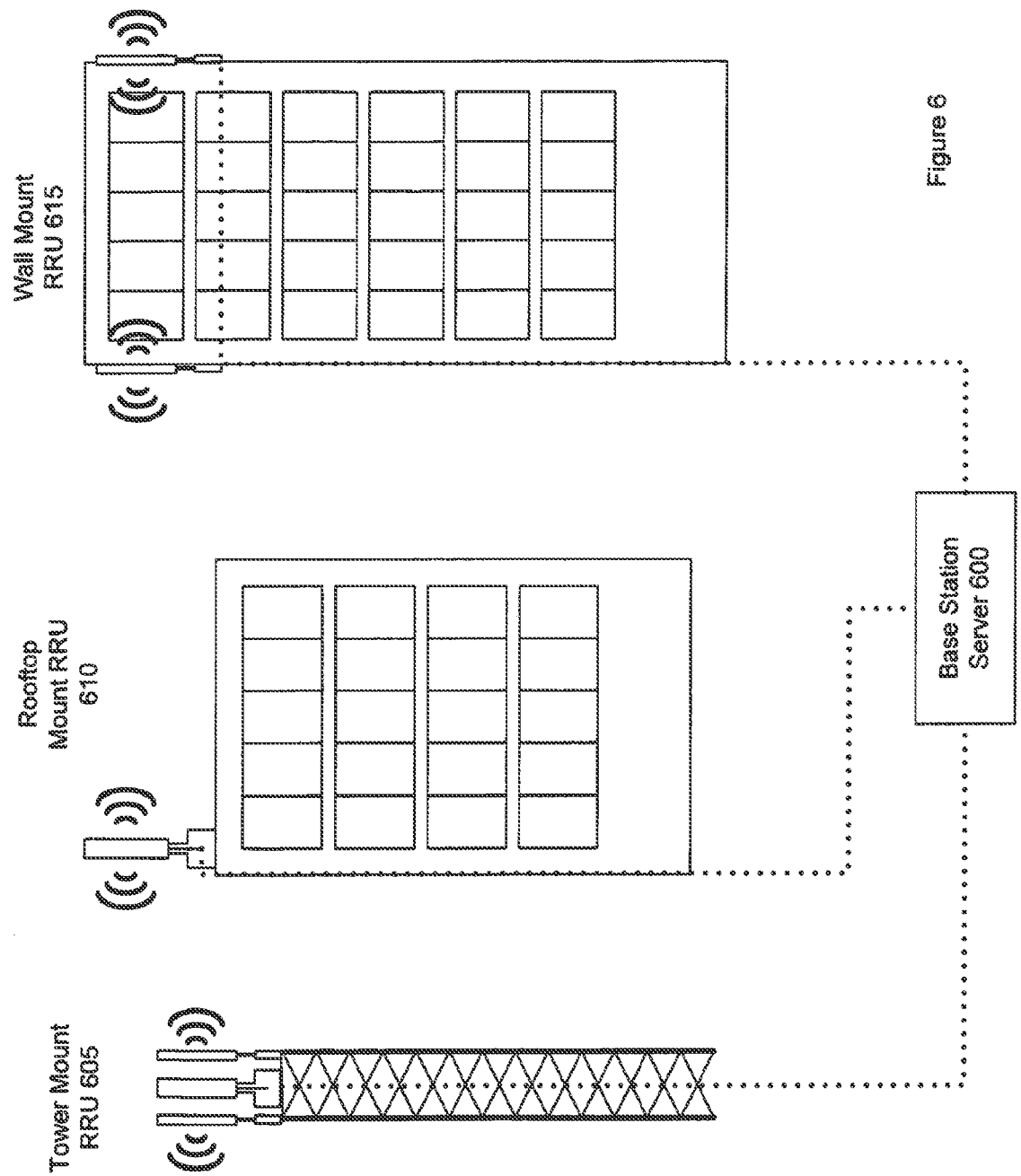
FIG. 6 depicts schematically a variety of potential installation schemes for an RRU-based system architecture.

FIG. 6 illustrates a plurality of possible implementations of an RRU-based system architecture, in with a base station server 600 is connected to, for example, a tower-mounted RRU 605, a rooftop-mounted RRU 610, and/or a wall-mounted RRU 615.

Figure 7:
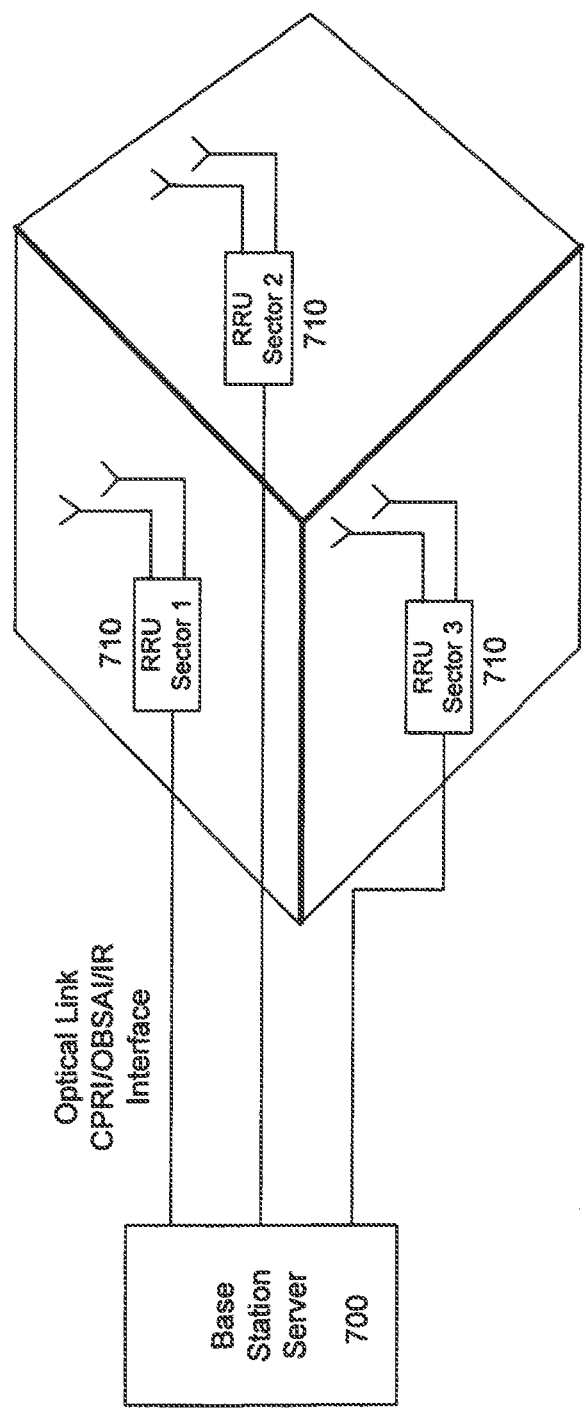
FIG. 7 depicts a three-sector arrangement of an RRU system architecture comprising optical links to a base station server.

FIG. 7 illustrates an embodiment of a three-sector implementation of an RRU-based system architecture, in which a base station server 700 is optically linked to a plurality of RRU's 710 to provide adequate coverage for a site.

Figure 8:
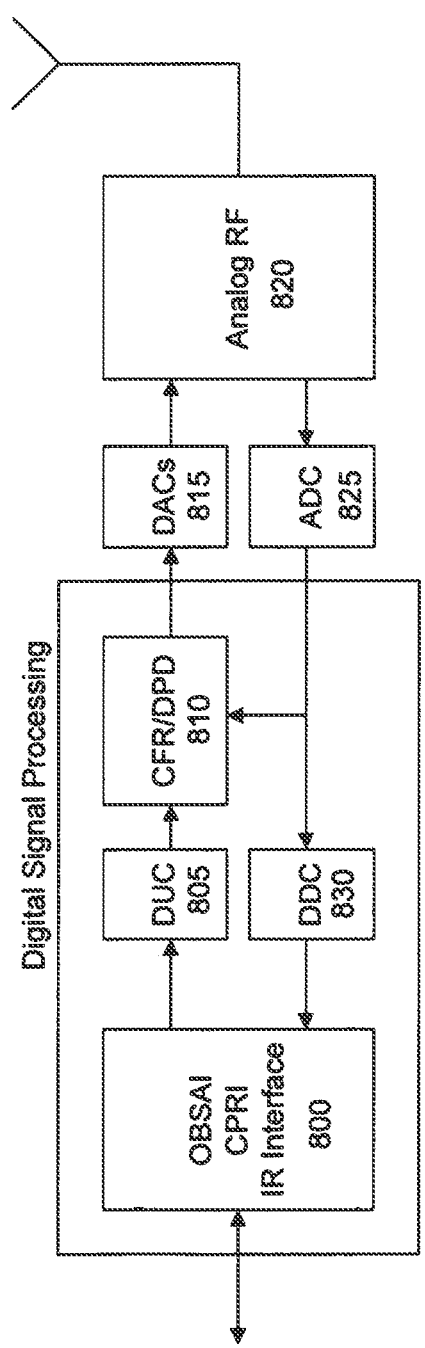
FIG. 8 shows in block diagram form various DSP-based functions including crest factor reduction and digital predistortion.

FIG. 8 illustrates in simplified form an embodiment of the DSP functionality of some implementations of the present invention. An input signal is fed to an interface 800, which can take several forms including OBSAI, CPRI or IR. The incoming signal is fed to a digital up-converter (DUO) 805 and then to CFR/DPD logic 810, such as an FPGA. The output of the CFR/DPD logic 810 is then supplied to a DAC 815. The DAC provides an output signal to the analog RF portion 820 of the system, which in turn provides a feedback signal to a ADC 825, and back through the DSP block in the form of inputs to the CFR/DPD and a DOC 830. The DOC outputs a signal to the interface 800, which in turn can provide an output.

Figure 9:
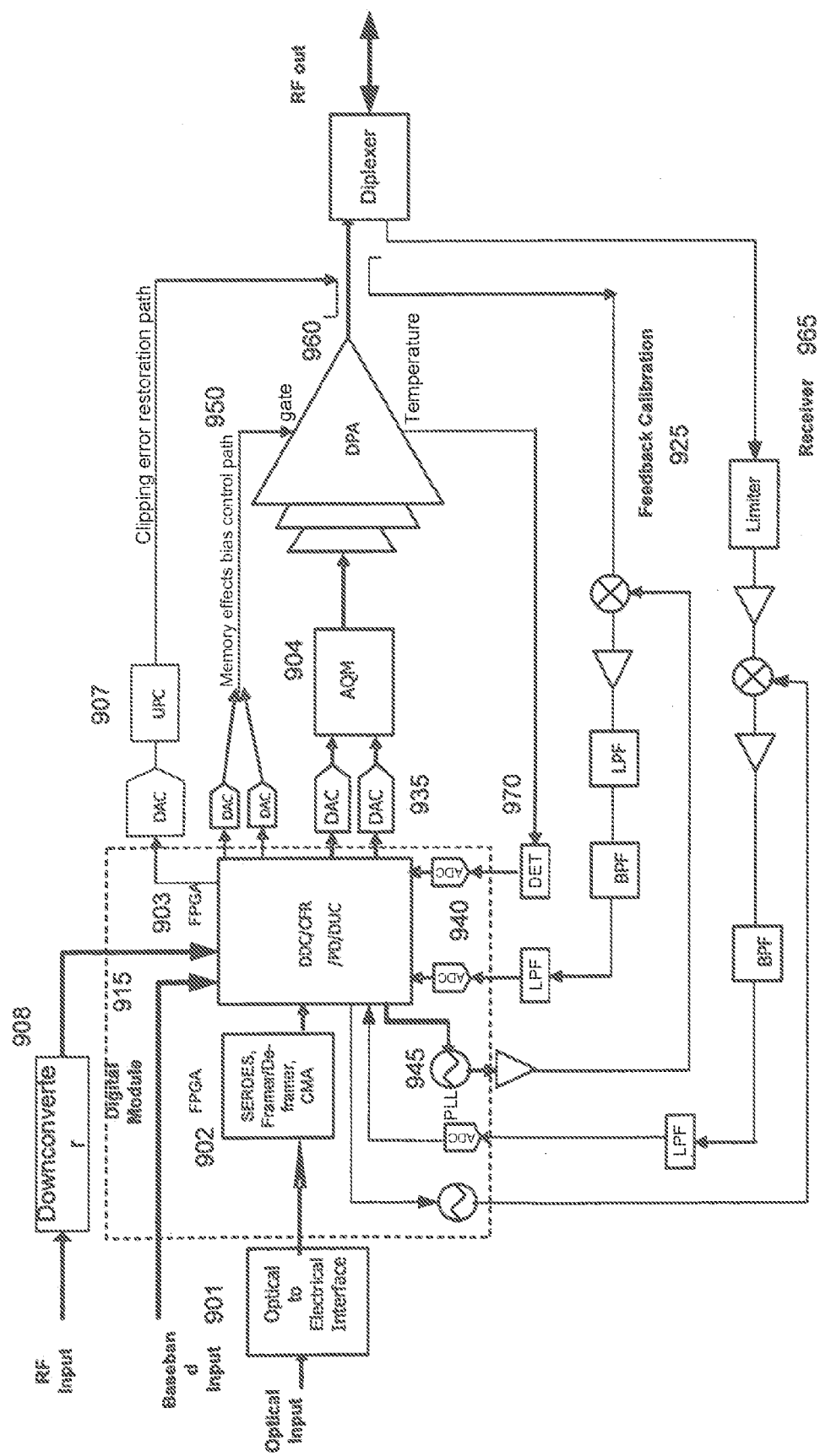
FIG. 9 is a Digital Hybrid Module with either an RF input signal or a baseband modulated signal or an optical interface according to another embodiment of the present invention.

FIG. 9 is a block diagram showing a more sophisticated embodiment of a RRU system, where like elements are indicated with like numerals. The embodiment of FIG. 9 applies crest factor reduction (CFR) prior to the PD with an adaptation algorithm in one digital processor, so as to reduce the PAPR, EVM and ACPR and compensate the memory effects and variation of the linearity due to the temperature changing of the PA. The digital processor can take nearly any form; for convenience, an FPGA implementation is shown as an example, but a general purpose processor is also acceptable in many embodiments. The CFR implemented in the digital module of the embodiments is based on the scaled iterative pulse cancellation presented in U.S. patent application Ser. No. 61/041,164, filed Mar. 31, 2008, entitled An Efficient Peak Cancellation Method For Reducing The Peak-To Average Power Ratio In Wideband Communication Systems, incorporated herein by reference. The CFR is included to enhance performance and hence optional. The CFR can be removed from the embodiments without-affecting the overall functionality.

FIG. 9 is a block diagram showing a RRU system according to one embodiment of the present invention. RRU systems typically comprise three primary blocks: power amplifiers, baseband processing and an optical interface. The optical interface contains an optical to electrical interface for the transmit/receive mode. The optical interface 901, shown in FIG. 9, is coupled to a FPGA. The FPGA 902 performs the functions of SERDES/Framer/DeFramer/Control and Management. This FPGA 902 interfaces with another FPGA 903 that performs the following Digital Signal Processing tasks: Crest Factor Reduction/Digital Upconversion/Digital Downconversion and Digital Predistortion. Another embodiment will be to integrate 902 with 903 in a single FPGA. The Serializer/De-serializer (SERDES) module converts the high speed serial bit stream from the optical to electrical receiver to a parallel bit stream. The De-Framer decodes the parallel bit stream and extracts the In-phase and Quadrature (I/Q) modulation and delivers this to the digital signal processing module 903. The Control and Management module extracts the control signals from the parallel bit stream and performs tasks based on the requested information. The received I/Q data from the optical interface is frequency translated to an Intermediate Frequency in the Digital Upconverter Module (DUC). This composite signal then undergoes Crest Factor Reduction (CFR) in order to reduce the peak to average power ratio. The resultant signal is then applied to a Digital Predistorter in order to compensate for the distortion in the Power Amplifier module 905. The RRU operates in a receive mode as well as a transmit mode. The RRU receives the signal from the output duplexer and passes this signal to the Rx path or paths, depending on the number of channels. The received signal is frequency translated to an Intermediate Frequency (IF) in the receiver (Rx1 and Rx2 in FIG. 10). The IF signal is further downconverted using a Digital Downconverter (DDC) module and demodulated into the In-phase and quadrature components. The recovered I/Q signal is then sent to the Framer module/SERDES and prepared for transmission over the optical interface.

The system of FIG. 9 has a multi-mode of RF or multi-carrier digital signal, which can be optical, at the input, and an RF signal at the output 910. The multi-mode of the signal input allows maximum flexibility: RF-in (the "RF•in Mode") or baseband digital-in (the "Baseband-in Mode") or optical input (the "Optical-in Mode"). The system shown in FIG. 9 comprises three key portions: a reconfigurable digital (hereinafter referred as "FPGA-based Digital") module 915, a power amplifier module 960, a receiver 965 and a feedback path 925.

The FPGA•based Digital part comprises either one of two digital processors 902, 903 (e.g. FPGA), digital-to-analog converters 935 (DACs), analog-to-digital converters 940 (ADCs), and a phase-locked loop (PLL) 945. Since the system shown in FIG. 9 has a multi-input mode, the digital processor has three paths of signal processing. For the baseband signal input path, the digital processor has implemented a digital up-converter (DUO), CFR, and a PD. For the optical input path, SERDES, Framer/Deframer, digital up-converter (DUC), CFR, and PD are implemented. For the RF input path, analog downconverter, DUC, CFR and PD are implemented.

The Baseband-in Mode of FIG. 9 contains the I-Q signals. Digital data streams from multi-channels as I-Q signals are coming to the FPGA-based Digital module and are digitally up-converted to digital IF signals by the DUO. These IF signals are then passed through the CFR block so as to reduce the signal's PAPR. This PAPR suppressed signal is digitally predistorted in order to pre-compensate for nonlinear distortions of the power amplifier.

In either input mode, the memory effects due to self-heating, bias networks, and frequency dependencies of the active device are compensated by the adaptation algorithm in the PD, as well. The coefficients of the PD are adapted by a wideband feedback which requires a very high speed ADC. The predistorted signal is passed through a DQM in order to generate the real signal and then converted to an IF analog signal by the DACs. As disclosed above, the DQM is not required to be implemented in the FPGA, or at all, in all embodiments. If the DQM is not used in the FPGA, then the AQM Implementation can be implemented with two DACs to generate real and imaginary signals 935, respectively. The gate bias voltage 950 of the power amplifier is determined by the adaptation algorithm and then adjusted through the DACs 935 in order to stabilize the linearity fluctuations due to the temperature changes in the power amplifier. The PLL 945 sweeps the local oscillation signal for the feedback part in order to translate the RF output signal to baseband, for processing in the Digital Module.

The power amplifier part comprises an AQM for receiving real and complex signals (such as depicted in the embodiments shown in FIG. 9) from the FPGA-based Digital module, a high power amplifier with multi-stage drive amplifiers, and a temperature sensor. In order to improve the efficiency performance of the DHMPA system, efficiency boosting techniques such as Doherty, Envelope Elimination and Restoration (EER), Envelope Tracking (ET), Envelope Following (EF), and Linear amplification using Nonlinear Components (LINC) can be used, depending upon the embodiment. These power efficiency techniques can be mixed and matched and are optional features to the fundamental RRU system. One such Doherty power amplifier technique is presented in commonly assigned U.S. Provisional Patent Application Ser. No. 60/925,577, filed Apr. 23, 2007, entitled N-Way Doherty Distributed Power Amplifier, incorporated herein by reference. To stabilize the linearity performance of the amplifier, the temperature of the amplifier is monitored by the temperature sensor and then the gate bias of the amplifier is controlled by the FPGA-based Digital part.

The feedback portion comprises a directional coupler, a mixer, a low pass filter (LPF), gain amplifiers and, and a band pass filter (BPF). Depending upon the embodiment, these analog components can be mixed and matched with other analog components. Part of the RF output signal of the amplifier is sampled by the directional coupler and then down converted to an IF analog signal by the local oscillation signal in the mixer. The IF analog signal is passing through the LPF, the gain amplifier, and the BPF which can capture the out-of-band distortions. The output of the BPF is provided to the ADC of the FPGA-based Digital module in order to determine the dynamic parameters of the PD depending on output power levels and asymmetrical distortions due to the memory effects. In addition, temperature is also detected by the DET 970 to calculate the variation of linearity and then adjust gate bias voltage of the PA. More details of the PD algorithm and self-adaptation feedback algorithm can be appreciated from FIG. 3, which shows a polynomial based predistortion algorithm and from FIG. 4, which shows the primary adaptive predistorter blocks which can be used in some embodiments of the invention.

In the case of a strict EVM requirement for broadband wireless access such as WiMAX or other OFDM based schemes (EVM<2.5%), the CFR in the FPGA-based Digital part is only able to achieve a small reduction of the PAPR in order to meet the strict EVM specification. In general circumstances, this means the CFR's power efficiency enhancement capability is limited. In some embodiments of the present invention, a novel technique is included to compensate the in-band distortions from CFR by use of a "Clipping Error Restoration Path" 907, hence maximizing the RRU system power efficiency in those strict EVM environments. As noted above, the Clipping Error Restoration Path has an additional DAC in the FPGA-based Digital portion and an extra UPC in the power amplifier part. The Clipping Error Restoration Path can allow compensation of in-band distortions resulting from the CFR at the output of the power amplifier. Further, any delay mismatch between the main path and the Clipping Error Restoration Path can be aligned using digital delay in the FPGA.

While FIG. 9 illustrates a RRU system implemented with AQM, according to another embodiment of the present invention, the system of FIG. 9 can also comprise a digital processor which has implemented therein CFR, PD, and an analog quadrature modulator corrector (AQMC).

Still further, the system of FIG. 9 can alternatively be configured to be implemented with AQM and an AQM-based Clipping Error Restoration Path. In such an arrangement, the Clipping Error Restoration Path can be configured to have two DACs in the FPGA-based Digital part and an AQM in lieu of the UPC in the power amplifier part.

Figure 10:
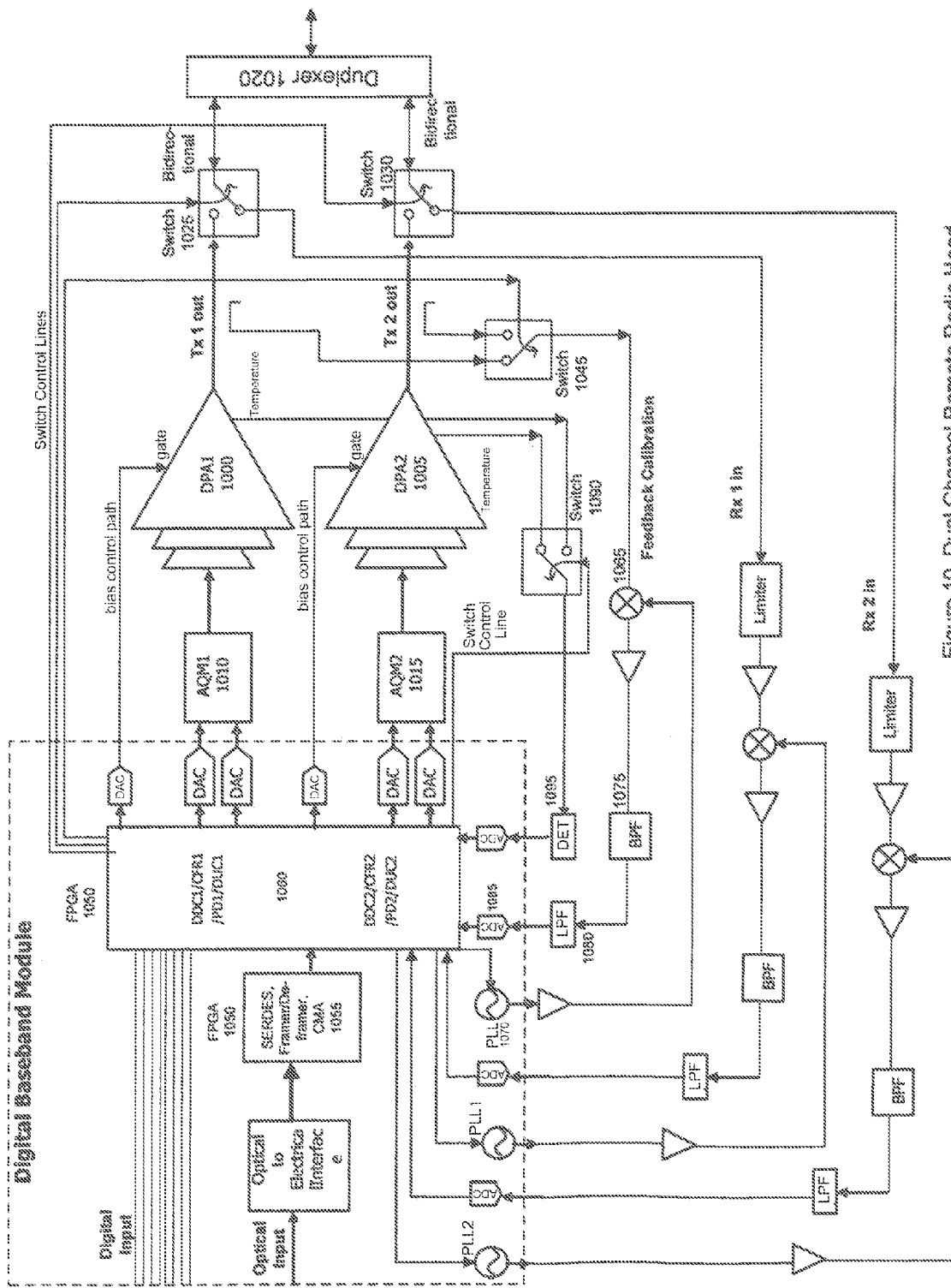
FIG. 10 is a Dual Channel Remote Radio head block diagram showing a digital hybrid module with an optical interface according to another embodiment of the present invention.

FIG. 10 is a block diagram showing a dual channel RRU implemented with two power amplifiers 1000 and 1005, respectively, for two distinct bands provided from AQM1 1010 and AQM2 1015. A duplexer 1020 is used to combine the two power amplifier outputs and provide the combined output to the antenna [not shown]. Switches 1025 and 1030 are used to isolate the transmit signals from the received signals as occurs in a Time Division Synchronous Code Division Multiple Access (TD-SCDMA) modulation. Feedback signals 1035 and 1040, derived from the output of PA's 1000 and 1005, are each provided to an additional switch 1045, which is toggled at appropriate times to permit feedback calibration of each PA with only a single FPGA 1050. In the embodiment shown, the FPGA 1050 comprises two blocks: SERDES Framer/Deframer and CMA, indicated at 1055, and a block 1060 comprising DDC1/CFR1/PDC1/DUC1 as well as DDC2/CFR2/PDC2/DUC2, with block 1060 controlling the switching timing of the associated switches. The feedback signals 1035 and 1040 are fed back to the block 1060 first through adder 1065, where they are combined with phase-locked-loop signal 1070, and then through band pass filter 1075, low pass filter 1080 and ADC 1085. In addition, temperature sensor signals from PA's 1000 and 1005 are fed back to the block 1060 through toggle switch 1090 and detector 1095 so that the predistortion coefficients can include temperature compensation. The toggling of the switches 1045 and 1090 is synchronized to ensure that the output and temperature signals of each PA are provided to block 1060 at the appropriate times. Another embodiment of the RRU extends its application to multi-frequency bands. In another embodiment, a multi-frequency band (i.e., two or more bands) implementation comprises adding additional channelized power amplifiers in parallel. The output of the additional power amplifiers is combined in an N by 1 duplexer and fed to a single antenna, although multiple antennae can also be utilized in some embodiments. Another embodiment of the multi-frequency band RRU combines two or more frequency bands in one or more of the power amplifiers.

Figure 11:
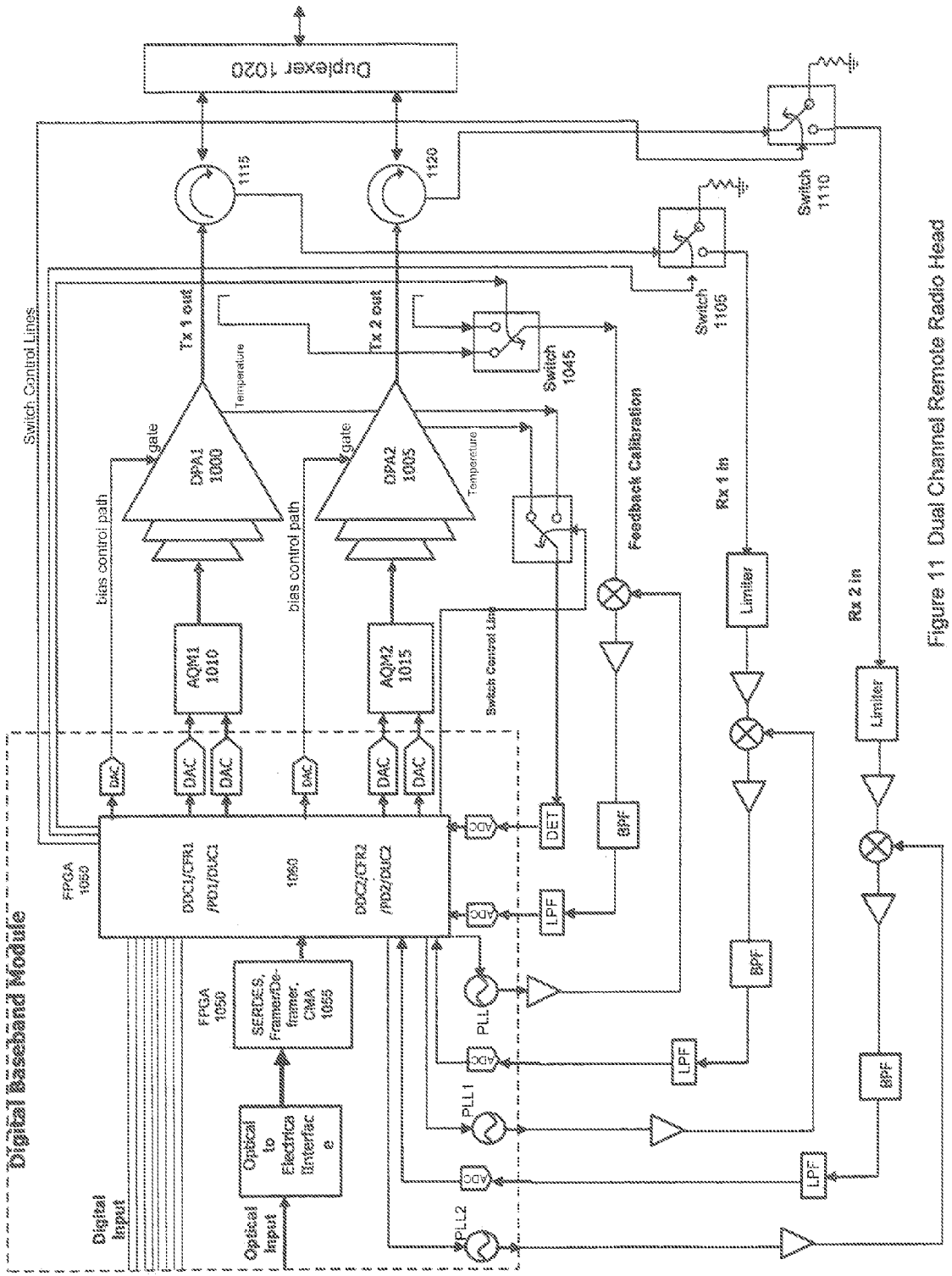
FIG. 11 is an alternative Dual Channel Remote Radio Head block diagram showing a digital hybrid module with an optical interface according to another embodiment of the present invention.

FIG. 11 is a block diagram showing another embodiment of the dual channel RRU. In this embodiment the Rx switches 1105 and 1110 are placed on the third port of circulators 1115 and 1120, thereby reducing the insertion loss between the PA output and the duplexer 1020. The remainder of FIG. 11 is substantially identical to FIG. 10 and is not described further.

Figure 12:
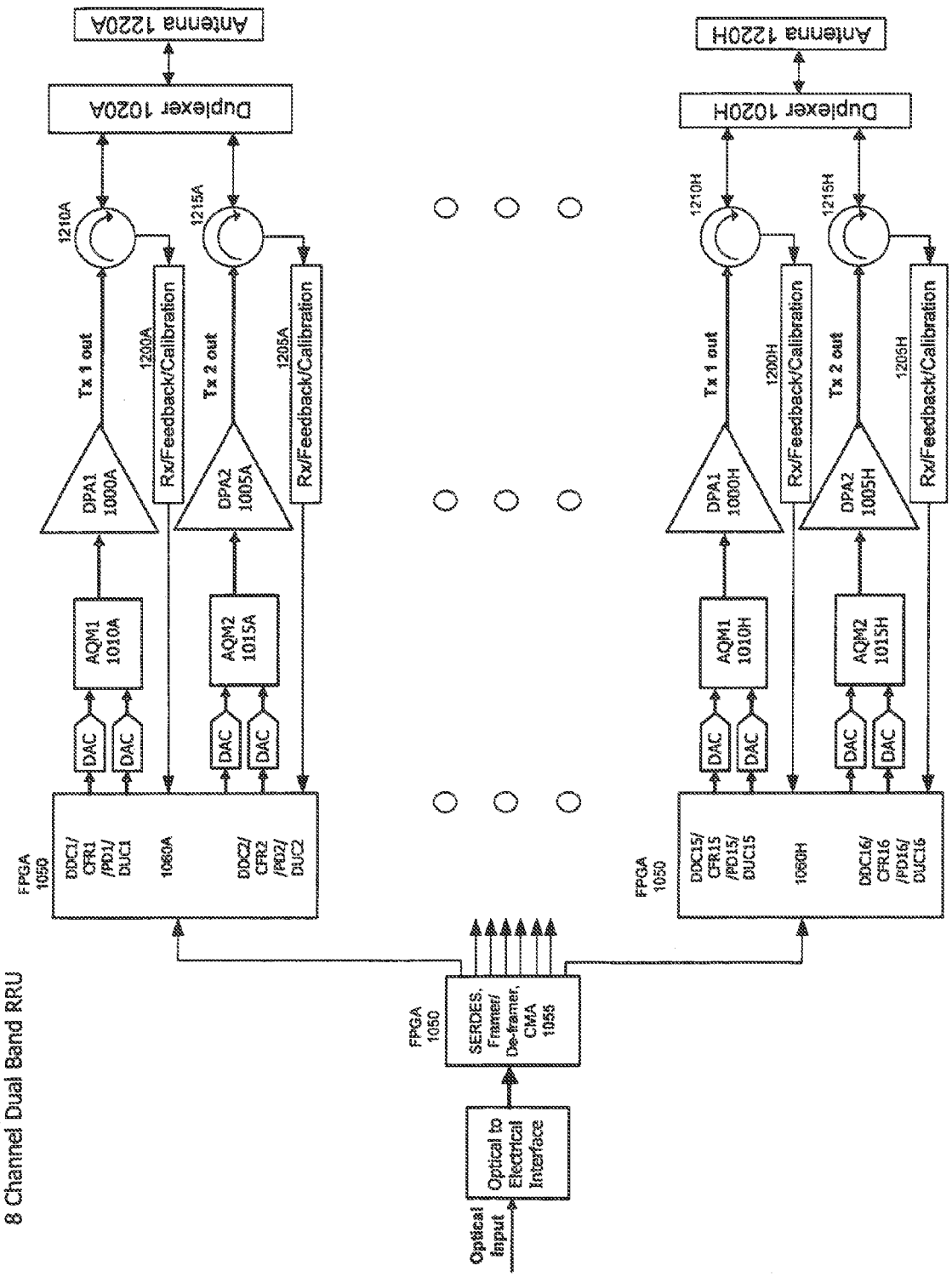
FIG. 12 is an 8 channel Dual Band Remote Radio Head block diagram showing a digital hybrid module with an optical interface, and further comprises a calibration algorithm for insuring that each power amplifier output is time-aligned, phase-aligned and amplitude-aligned with respect to each other.

FIG. 12 is a block diagram showing an embodiment of an 8 channel dual-band RRU. In this embodiment, the feedback path for each PA 1000A-H and 1005A-H comprises a receiver chain plus a wideband capture chain, indicated at 1200A-H and 1205A-H, respectively, receiving feedback signals from the array of associated PA's through associated circulators 1210A-H and 1215A-H. The receiver chain is utilized when the RRU is switched to a receive mode and corresponds to the receive (Rx) paths shown in FIG. 11. The wideband capture chain is utilized for capturing the wideband distortion of the power amplifier, and corresponds to the Feedback Calibration path shown in FIG. 11. In an embodiment a channel calibration algorithm is implemented to insure that each power amplifier output is time, phase and amplitude aligned to each other.

Digital Predistorter Algorithm

Digital Predistortion (DPD) is a technique to linearize a power amplifier (PA). FIG. 1 shows the block diagram of linear digitally predistorted PA. In the DPD block, a memory polynomial model is used as the predistortion function (FIG. 3).

$$z(n) = \sum_{i=0}^{n-1} x_i(n-i) \left( \sum_{j=0}^{k-1} a_{ij} |x_i(n-i)|^j \right)$$

where $a_{ij}$ are the DPD coefficients.

In the DPD estimator block, a least square algorithm is utilized to find the DPD coefficients $a_{ij}$, and then transfer them to DPD block. The primary DPD blocks are shown in FIG. 4.

Delay Estimation Algorithm:

The DPD estimator compares x(n) and its corresponding feedback signal y(n−Δd) to find the DPD coefficients, where Δd is the delay of the feedback path. As the feedback path delay is different for each PA, this delay should be identified before the signal arrives at the coefficient estimation. In this design, the amplitude difference correlation function of the transmission, x(n), and feedback data, y(n), is applied to find the feedback path delay. The correlation is given by $$c(m) = \sum_{i=0}^{N-1} \text{sign}(x(i+1) - x(i)) \text{sign}(y(i+m+1) - y(i+m))$$

$$n(\text{delay}) = \text{Max}(C(m))$$

The delay n that maximizes the correlation C(m) is the feedback path delay.

Since the feedback path goes through analog circuitry, the delay between the transmission and feedback path could be a fractional sample delay. To synchronize the signals more accurately, fractional delay estimation is necessary. To simplify the design, only a half-sample delay is considered in this design, although smaller fractional delays can also be utilized.

To get the half-sample delay data, an upsampling approach is the common choice, but in this design, in order to avoid a very high sampling frequency in the FPGA, an interpolation method is used to get the half-sample delay data. The data with integer delay and fractional delay are transferred in parallel. The interpolation function for fractional delay is $$y(n) = \sum_{i=0}^{3} c_i x(n+i)$$

in which $c_i$ is the weight coefficient.

Whether the fractional delay path or the integer delay path will be chosen is decided by the result of the amplitude difference correlator. If the correlation result is odd, the integer path will be chosen, otherwise the fractional delay path will be chosen.

Phase Offset Estimation and Correction Algorithm:

Phase offset between the transmission signal and the feedback signal exists in the circuit. For a better and faster convergence of the DPD coefficient estimation, this phase offset should be removed.

The transmission signal x(n) and feedback signal y(n) can be expressed as $$x(n) = |x(n)|e^{j\theta_x} \text{ and } y(n) = |y(n)|e^{j\theta_y},$$

The phase offset $e^{j(\theta_x - \theta_y)}$ can be calculated through $$e^{j(\theta_x - \theta_y)} = \frac{x(n)y(n)^*}{|x(n)||y(n)|}$$

So, the phase offset between the transmission and feedback paths is $$e^{j\theta_e} = \text{mean}\left(\frac{x(n)y(n)^*}{|x(n)||y(n)|}\right)$$

The feedback signal with the phase offset removed can be calculated by $$\bar{y}(n) = y(n)e^{j\theta_e}$$

Magnitude Correction:

As the gain of the PA may change slightly, the feedback gain should be corrected to avoid the error from the gain mismatch. The feedback signal is corrected according to the function $$\bar{y}(n) = y(n) \frac{\sum_{i=1}^{N} |x(i)|}{\sum_{i=1}^{N} |y(i)|}$$

The choice of N will depend on the accuracy desired.

QR_RLS Adaptive Algorithm:

The least square solution for DPD coefficient estimation is formulated as $$F(x(n)) = y(n)$$

$$F(x(n)) = \sum_{i=1}^{N} \sum_{j=0}^{K} a_{ij} x(n-i) |x(n-i)|^j$$

Define $h_k = x(n-i)|x(n-i)|^j$, $w_k = a_{ij}$, where $k=(i-1)N+j$. The least square formulation can be expressed as:

$$\sum_{k=1}^{N \times K} w_k h_k = y(n)$$

In this design, QR-RLS algorithm (Haykin, 1996) is implemented to solve this problem. The formulas of QR_RLS algorithm are $$\begin{cases} d(i) \triangleq y(i) - h_i \overline{w} \\ \overline{w}_i \triangleq w_i - \overline{w} \\ q_i \triangleq \phi_i^{*/2}[w_i - \overline{w}] \end{cases}$$

where $\phi_i$ is a diagonal matrix, and $q_i$ is a vector.

The QR_RLS algorithm gets the ith moment $\phi_i$ and $q_i$ from its (i-1)th moment through a unitary transformation:

$$A = \begin{bmatrix} \phi_i^{\frac{1}{2}} & 0 \\ q_1^* & e_a^*(i)\gamma^{\frac{1}{2}}(i) \\ h_i \Phi_1^{-\frac{1}{2}} & \gamma^{\frac{1}{2}}(i) \end{bmatrix} = \begin{bmatrix} \lambda^{\frac{1}{2}} \phi_{i-1}^{\frac{1}{2}} & h_i^* \\ \lambda^{\frac{1}{2}} q_{i-1}^* & d(i)^* \\ 0 & 1 \end{bmatrix} \theta_i$$

$\theta_i$ is a unitary matrix for unitary transformation.

To apply QR_RLS algorithm more efficiently in FPGA, a squared-root-free Givens rotation is applied for the unitary transformation process (E. N. Frantzeskakis, 1994)

$$\begin{bmatrix} a_1 & a_2 & \ldots & a_n \\ b_1 & b_2 & \ldots & b_n \end{bmatrix} = \begin{bmatrix} \sqrt{k_a} & 0 \\ 0 & \sqrt{k_b} \end{bmatrix} \begin{bmatrix} a'_1 & a'_2 & \ldots & a'_n \\ b'_1 & b'_2 & \ldots & b'_n \end{bmatrix}$$

$$\begin{bmatrix} a'_1 & a'_2 & \ldots & a'_n \\ b'_1 & b'_2 & \ldots & b'_n \end{bmatrix} \theta = \begin{bmatrix} \sqrt{k'_a} & 0 \\ 0 & \sqrt{k'_b} \end{bmatrix} \begin{bmatrix} 1 & a''_2 & \ldots & a''_n \\ 0 & b''_2 & \ldots & b''_n \end{bmatrix}$$

$k'_a = k_a a_1^2 + k_b b_1^2$ $k'_b = \dfrac{k_a k_b}{k'_a}$ $a'_j = (k_a a_1 a_j + k_b b_1 b_j)/k'_a$ $b'_j = -b_1 a_j + a_1 b_j$ For RLS algorithm, the $i^{th}$ moment is achieved as below:

$$\begin{bmatrix} \lambda^{\frac{1}{2}} \phi_{i-1}^{\frac{1}{2}} & h_i^* \\ \lambda^{\frac{1}{2}} q_{i-1}^* & d(1)^* \\ 0 & 1 \end{bmatrix} \theta_i = \begin{bmatrix} \phi_1^{\frac{1}{2}} & 0 \\ \overline{q_1^*} & e_a^*(1)\gamma^{\frac{1}{2}}(1) \\ h_1 \Phi_1^{-\frac{1}{2}} & \gamma^{\frac{1}{2}}(1) \end{bmatrix} \begin{bmatrix} \sqrt{k_a} & 0 \\ 0 & \sqrt{k_b} \end{bmatrix}$$

$w_i$ can be obtained by solving $$\overline{\Phi^{\frac{1}{2}}}[w_i - \overline{w}] = \overline{q_1}$$

In the iterative process, a block of data (in this design, there are 4096 data in one block) is stored in memory, and the algorithm uses all the data in memory s to estimate the DPD coefficient. In order to make the DPD performance more stable, the DPD coefficients are only updated after one block of data are processed. The matrix A will be used for the next iteration process, which will make the convergence faster.

To make sure the performance of the DPD is stable, a weighting factor f is used when updating the DPD coefficient as $w_i = f \times w_i - 1 + (1-f)w_1$ The DPD coefficient estimator calculates coefficients $w_i$ by using QR_RLS algorithm. These $w_i$ are copied to the DPD block to linearize the PA.

Channel Calibration Algorithm

The 8 channel RRU in FIG. 12 has 16 distinct power amplifiers, indicated at PA's 1000A-H and 1005A-H. Half the power amplifiers are designed for one band and the other for a second band. The bands are hereafter referred to as band A and band B, and occupy two distinct frequencies. The 8 channel RRU uses eight antennas 1220A-H and both bands will coexist on each antenna. In order to maximize performance, each power amplifier's output signal needs to be time, phase and amplitude aligned with respect to each other. The antenna calibration algorithms comprise three distinct approaches: 1) A Pilot Tone is injected into each PA; 2) a Reference Modulated signal is transmit through each PA; or 3) the Real Time I/Q data is used as the reference signal. The Pilot Tone approach injects a single carrier IF tone that is tracked in either the feedback calibration path or the individual PA's receiver. Each transmitter path for band A is time, phase and amplitude aligned with respect to each other, similarly for band B. The Reference Modulated approach utilizes a stored complex modulated signal which is transmitted through each of the band A PA's, similarly for the band B PA's. The transmitters are then time, phase and amplitude aligned with respect to each other. Either the feedback calibration path or the individual receivers can be used for obtaining the PA output signals. The Real Time approach operates on the real-time transmitted signals. This approach utilizes the DPD time alignment, phase and magnitude offset information to synchronize each PA output with respect to each other.

In summary, the RRU system of the present invention enhances the performance in terms of both the efficiency and the linearity more effectively since the RRU system is able to implement CFR, DPD and adaptation algorithm in one digital processor, which subsequently saves hardware resources and processing time. The high power efficiency of RF power amplifiers inside the RRU means that less thermal dissipation mechanism such as heat sinks is needed; therefore, significantly reducing the size and volume of the mechanical housing. This smaller RRU can then enable service providers to deploy the RRU in areas where heavy or large RRU's could not be deployed, such as pole tops, top of street lights, etc. due to lack of real estate, or weight limitation, wind factor, and other safety issues. The RRU system of the present invention is also reconfigurable and field-programmable since the algorithms and power efficiency enhancing features which are embedded in firmware can be adjusted similarly to a software upgrade in the digital processor at anytime.

Moreover, the RRU system is agnostic to modulation schemes such as QPSK, QAM, OFDM, etc. in CDMA, TD-SCDMA, GSM, WCDMA, CDMA2000, and wireless LAN systems. This means that the RRU system is capable of supporting multi-modulation schemes, multi-carriers and multi-channels. The multi-frequency bands benefits mean that mobile operators can deploy fewer RRUs to cover more frequency bands for more mobile subscribers; hence significantly reducing CAPEX and OPEX. Other benefits of the RRU system include correction of PA non-linearities in repeater or indoor coverage systems that do not have the necessary baseband signals information readily available.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

We claim:

1. A multiple-channel remote radio head unit for wireless communications comprising:
    a plurality of power amplifiers, each receiving an input signal and each providing as an output an amplified representation of the received input signal;
    a plurality of feedback paths, wherein each feedback path in the plurality of feedback paths provides a feedback signal that includes a representation of a characteristic of a power amplifier of the plurality of power amplifiers;
    digital logic for processing signals;
    a feedback switch for selecting one of the feedback signals for connection to the digital logic to generate predistortion compensation signals for each of the plurality of power amplifiers;
    a plurality of circulators, each coupled to the output of a power amplifier of the plurality of power amplifiers;
    a duplexer coupled to the plurality of circulators; and
    a plurality of receiver switches, each coupled to a circulator of the plurality of circulators, that selectively couples a respective circulator to the digital logic to reduce insertion loss between the plurality of power amplifiers and the duplexer.

2. The multiple-channel remote radio head unit of claim 1, wherein the plurality of power amplifiers are coupled to the digital logic using a bias control path.

3. The multiple-channel remote radio head unit of claim 1, wherein the digital logic is configured to determine, for a power amplifier of the plurality of power amplifiers, a value for a power-related variable associated with the power amplifier.

4. The multiple-channel remote radio head unit of claim 1, wherein the digital logic is further configured to determine a predistortion to apply based on a determined value.

5. The multiple-channel remote radio head unit of claim 1, further comprising an RF input and a baseband input coupled to the digital logic.

6. The multiple-channel remote radio head unit of claim 1, wherein the digital logic is configured to apply crest factor reduction to one of the input signals.

7. The multiple-channel remote radio head unit of claim 1, further comprising:
    a plurality of temperature sensors, at least one associated with each power amplifier for providing a temperature signal that represents the temperature of the associated power amplifier; and
    a temperature switch, controlled by the digital logic, for selecting one of the temperature signals for connection to the digital logic.

8. The multiple-channel remote radio head unit of claim 7, further comprising an analog to digital converter configured to convert the temperature signal to a digital signal for the digital logic.

9. The multiple-channel remote radio head unit of claim 1, further comprising an optical to electrical interface coupled to the digital logic.

10. A method comprising:
    receiving, at each of a plurality of power amplifiers, an input signal;
    amplifying, at each of the plurality of power amplifiers, the input signal to produce an output, provided to a circulator of a plurality of circulators, that includes an amplified representation of the received input signal;
    providing a plurality of feedback paths, wherein each feedback path in the plurality of feedback paths provides a feedback signal that includes a representation of a characteristic of a power amplifier of the plurality of power amplifiers;
    selecting one of the feedback signals for connection to digital logic to generate predistortion compensation signals for each of the plurality of power amplifiers; and
    selectively coupling a circulator of the plurality of circulators to the digital logic to reduce insertion loss between the plurality of power amplifiers and a duplexer coupled to the plurality of circulators.

11. The method of claim 10, wherein the plurality of power amplifiers are coupled to the digital logic using a bias control path.

12. The method of claim 10, further comprising:
    determining, by the digital logic and for a power amplifier of the plurality of power amplifiers, a value of a power-related variable associated with the power amplifier.

13. The method of claim 12, further comprising:
    determining, by the digital logic, a predistortion to apply based on a determined value.

14. The method of claim 10, further comprising:
    receiving an RF input and a baseband input at the digital logic.

15. The method of claim 10, further comprising:
    applying crest factor reduction to one of the input signals.

16. The method of claim 10, further comprising:
    providing a plurality of temperature sensors, at least one associated with each power amplifier for providing a temperature signal that represents the temperature of the associated power amplifier; and
    selecting one of the temperature signals for connection to the digital logic.

17. The method of claim 16, further comprising:
    converting the temperature signal to a digital signal for the digital logic.

18. The method of claim 10, further comprising:
    receiving, at an optical to electrical interface, an optical signal input to the digital logic.

* * * * *